US012787441B2

(12) United States Patent
Sung et al.

(10) Patent No.: US 12,787,441 B2
(45) Date of Patent: Nov. 3, 2026

(54) ARRAY SUBSTRATE, DISPLAY STRUCTURE AND DISPLAY DEVICE

(71) Applicant: E Ink Holdings Inc., Hsinchu (TW)

(72) Inventors: Chao Feng Sung, Hsinchu (TW); Chen Chu Tsai, Hsinchu (TW); Ming-Huan Yang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 417 days.

(21) Appl. No.: 18/407,443

(22) Filed: Jan. 9, 2024

(65) Prior Publication Data

US 2024/0321900 A1 Sep. 26, 2024

Related U.S. Application Data

(60) Provisional application No. 63/453,168, filed on Mar. 20, 2023.

(51) Int. Cl.

| | |
|---|---|
| ***H10D 86/60*** | (2025.01) |
| ***G02F 1/1343*** | (2006.01) |
| ***G02F 1/167*** | (2019.01) |
| ***G02F 1/16755*** | (2019.01) |
| ***G02F 1/16756*** | (2019.01) |
| ***G02F 1/1676*** | (2019.01) |

(Continued)

(52) U.S. Cl.

CPC ......... *H10D 86/60* (2025.01); *G02F 1/13439* (2013.01); *G02F 1/167* (2013.01); *G02F 1/16755* (2019.01); *G02F 1/16756* (2019.01); *G02F 1/1676* (2019.01); *G02F 1/16766* (2019.01); *H10D 86/441* (2025.01)

(58) Field of Classification Search

CPC ................................ H10D 86/60; G02F 1/167

See application file for complete search history.

(56) References Cited

U.S. PATENT DOCUMENTS

| | | | |
|---|---|---|---|
| 9,568,800 | B1 | 2/2017 | Sprague |
| 10,209,602 | B2 | 2/2019 | Harris |

(Continued)

FOREIGN PATENT DOCUMENTS

| | | |
|---|---|---|
| CN | 101276118 | 10/2008 |
| CN | 105573003 | 5/2016 |
| CN | 105885722 | 7/2018 |

OTHER PUBLICATIONS

"Office Action of Taiwan Counterpart Application", issued on Jun. 10, 2025, p. 1-p. 4.

*Primary Examiner* — Joseph L Williams

(74) *Attorney, Agent, or Firm* — JCIPRNET

(57) ABSTRACT

An array substrate includes a substrate, a gate line, multiple active elements, a protective layer, a pixel electrode, and an extension electrode. The substrate has an active area and a peripheral area. The gate line and the active elements are disposed in the active area of the substrate. The protective layer is disposed on the substrate and covers the gate lines and the active elements. The protective layer has multiple openings-exposing a portion of the gate line and a portion of the active elements. The pixel electrode is extended to and disposed in the openings of the protective layer to electrically connect to the gate line and the active elements. The extension electrode is disposed in the peripheral area and located on the protective layer. A portion of the extension electrode is extended to and overlapped with the pixel electrode and is electrically connected to the pixel electrode.

9 Claims, 5 Drawing Sheets

(51) Int. Cl.

*G02F 1/16766* (2019.01)
*H10D 86/40* (2025.01)

(56) References Cited

U.S. PATENT DOCUMENTS

| | | | |
|---|---|---|---|
| 11,079,620 | B2 | 8/2021 | Inagaki et al. |
| 11,295,661 | B2 | 4/2022 | Bae et al. |
| 2011/0026099 | A1* | 2/2011 | Kwon ............... G02F 1/133345 445/24 |
| 2012/0069273 | A1 | 3/2012 | Watanabe |
| 2017/0059746 | A1 | 3/2017 | Tung et al. |
| 2022/0399512 | A1 | 12/2022 | Park et al. |
| 2023/0020481 | A1 | 1/2023 | Qin et al. |

* cited by examiner

ARRAY SUBSTRATE, DISPLAY STRUCTURE AND DISPLAY DEVICE

CROSS-REFERENCE TO RELATED APPLICATION

This application claims the priority benefit of U.S. Provisional application Ser. No. 63/453,168, filed on Mar. 20, 2023. The entirety of the above-mentioned patent application is hereby incorporated by reference herein and made a part of this specification.

BACKGROUND

Technical Field

This disclosure relates to a substrate, a structure, and an electronic device, and in particular to an array substrate, a display structure, and a display device.

Description of Related Art

With the advancement of technology, various display media are widely used in various display applications, such as TVs, laptops, e-paper books and mobile phones, large-scale advertising signboards, and various electronic labels in stores. Display panels, such as electrophoretic display (EPD), not only have the advantages of light weight and thin thickness, with the use of flexible substrates, but also can be designed to have the advantages of flexibility and unbreakable, which is very suitable for use as a display medium for In-Mold Electronics (IME).

Generally speaking, the substrate in a display panel has a display area and a non-display area (i.e., the border area). The non-display area is the area where a certain width needs to be reserved for the packaging of the modules of the current display panel, and this area results in an obvious border design on the product, which in turn affects the user's experience.

SUMMARY

The disclosure provides an array substrate in which a peripheral area is provided with an extension electrode, and thus also has ability of controlling a display medium, which may be matched with an image display to present different colors.

The disclosure further provides a display structure in which a passive display area is provided with an extension electrode, and a thickness of the extension electrode is less than 20 microns, so that when a display device is formed by subsequently bonding with an array substrate, the display device may be formed without an active/passive drive display seam.

The disclosure further provides a display device including the array substrate or the display structure. A peripheral area/passive display area also has ability of controlling a display medium layer, which may be matched with an image display to present specific colors.

The array substrate of the disclosure includes a substrate, a gate line, multiple active elements, a protective layer, a pixel electrode, and an extension electrode. The substrate has an active area and a peripheral area located around the active area. The gate line is disposed in the active area of the substrate. The active elements are distributed in the active area of the substrate. The protective layer is disposed on the substrate and covers the gate line and active element. The protective layer has multiple openings, and the opening exposes a portion of the gate line and a portion of the active elements. The pixel electrode is disposed in the active area of the substrate and is located on the protective layer. The pixel electrode is extended to and disposed in the openings of the protective layer to electrically connect to the gate line and the active elements. The pixel electrode includes at least one passively driven pixel electrode. The extension electrode is disposed in the peripheral area of the substrate and is located on the protective layer. A portion of the extension electrode is extended to and overlapped with the at least one passively driven pixel electrode of the pixel electrode and is electrically connected to the pixel electrode.

In an embodiment of the disclosure, a material of the pixel electrode is different from a material of the extension electrode.

In an embodiment of the disclosure, the material of the pixel electrode includes indium tin oxide (ITO) or indium zinc oxide (IZO). The material of the extension electrode includes poly ethylene dioxythiophene (PEDOT) compound, silver paste, or carbon paste.

The display structure of the disclosure includes a transparent substrate, a display medium layer, a conductive electrode, and an extension electrode. The transparent substrate has an active display area and a passive display area located around the active display area. The display medium layer is disposed in the active display area and the passive display area of the transparent substrate. The conductive electrode is disposed in the active display area and the passive display area of the transparent substrate, and is located between the transparent substrate and the display medium layer. The extension electrode is disposed in the passive display area of the transparent substrate. The display medium layer is located between the conductive electrode and the extension electrode. The conductive electrode has a first thickness, the extension electrode has a second thickness, and the second thickness is less than 20 microns.

In an embodiment of the disclosure, the display structure further includes a first protective film and a second protective film. The first protective film is disposed in the active display area and the passive display area of the transparent substrate, and is located between the display medium layer and the conductive electrode. The second protective film is disposed in the active display area and the passive display area of the transparent substrate, and is located between the display medium layer and the extension electrode.

In an embodiment of the disclosure, a material of the conductive electrode and the extension electrode include poly ethylene dioxythiophene compound, silver paste, or carbon paste, respectively.

The display device of the disclosure includes an array substrate and a display structure. The array substrate includes a substrate, a gate line, multiple active elements, a protective layer, and a pixel electrode. The substrate has an active area and a peripheral area located around the active area. The gate line is disposed in the active area of the substrate. The active elements are distributed in the active area of the substrate. The protective layer is disposed on the substrate and covers the gate line and the active elements. The protective layer has multiple openings, and the openings expose a portion of the gate line and a portion of the active elements. The pixel electrode is disposed in the active area of the substrate and is located on the protective layer. The pixel electrode is extended to and disposed in the openings of the protective layer to electrically connect to the gate line and the active elements. The pixel electrode includes at least one passively driven pixel electrode. The display structure includes a transparent substrate, a display medium layer, and a conductive electrode. The transparent substrate has an active display area and a passive display area located around the active display area. The display medium layer is disposed in the active display area and the passive display area of the transparent substrate. The conductive electrode is disposed in the active display area and the passive display area of the transparent substrate, and is located between the transparent substrate and the display medium layer. One of the array substrate and the display structure further includes an extension electrode, and the extension electrode meets one of the following conditions: (1) the extension electrode disposed in the peripheral area of the substrate and located on the protective layer, and a portion of the extension electrode extended to and overlapped with the at least one passively driven pixel electrode of the pixel electrode and electrically connected to the pixel electrode; and (2) the extension electrode disposed in the passive display area of the transparent substrate, and the display medium layer located between the conductive electrode and the extension electrode, in which the conductive electrode has a first thickness, the extension electrode has a second thickness, and the second thickness is less than 20 microns.

In an embodiment of the disclosure, a material of the pixel electrode is different from a material of the extension electrode.

In an embodiment of the disclosure, the array substrate includes an extension electrode. The display medium layer of the display structure is located on the pixel electrode and extension electrode of the array substrate.

In an embodiment of the disclosure, the display structure includes an extension electrode. The extension electrode is electrically connected to the pixel electrode of the array substrate and is extended outside the array substrate.

Based on the above, in the design of the disclosure, the array substrate or the display structure includes the extension electrode, and the extension electrode is disposed in the peripheral area/passive display area, so that the peripheral area/passive display area also has ability of controlling the display medium layer located in the peripheral area/passive display area. Thus, when the array substrate is bonded to the display structure to form a display device, the peripheral area may be matched with an image display to present different colors, which may customize color of a border to make the overall presentation of the display device more consistent, so as to achieve a borderless user experience for users.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Embodiments of the disclosure are to be understood in conjunction with the drawings, and the drawings of the disclosure are to be considered as part of the disclosure. It should be understood that the drawings of the disclosure are not drawn to scale and, in fact, the dimensions of elements may be arbitrarily enlarged or reduced to clearly show the features of the disclosure.

Figure 1A:
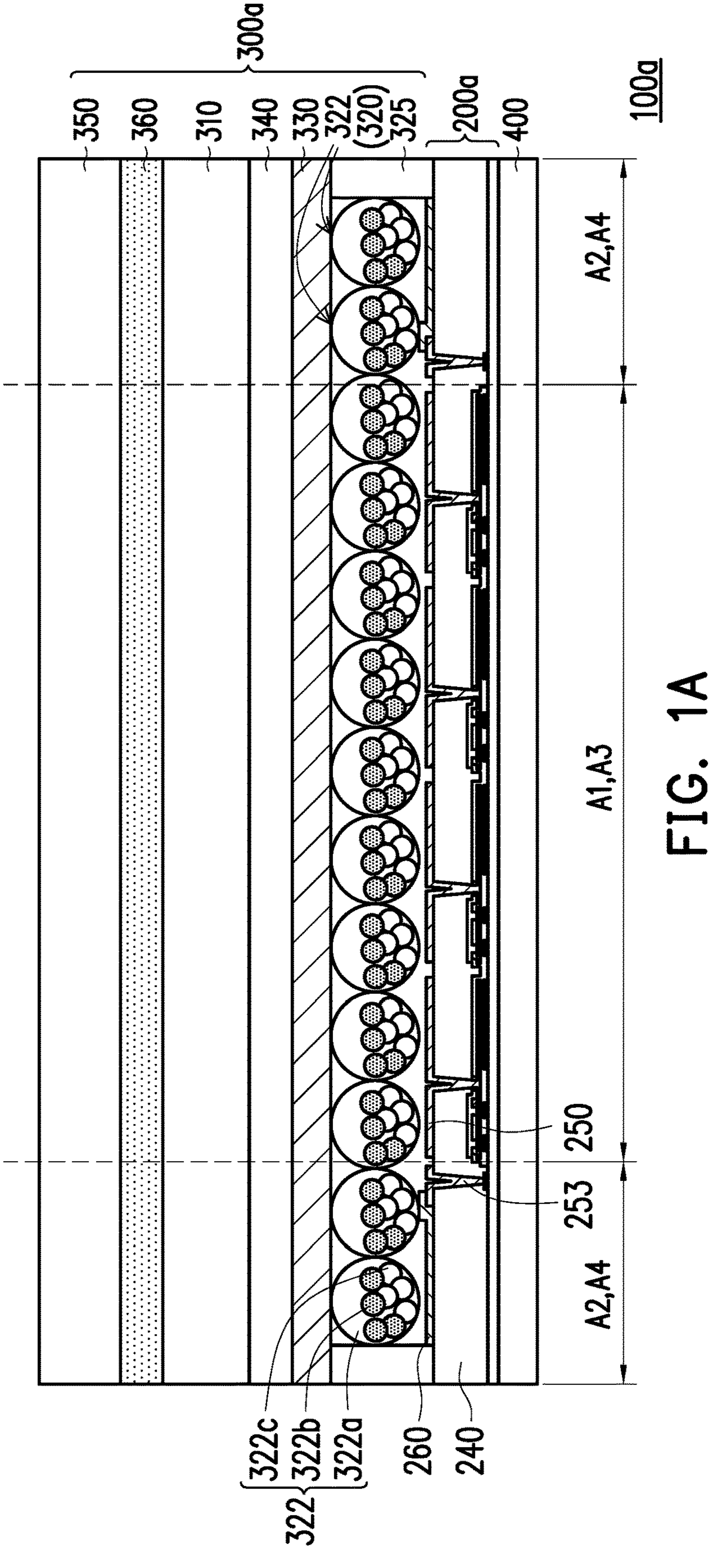
FIG. 1A is a schematic cross-sectional view of a display device according to an embodiment of the disclosure.
Figure 1B:
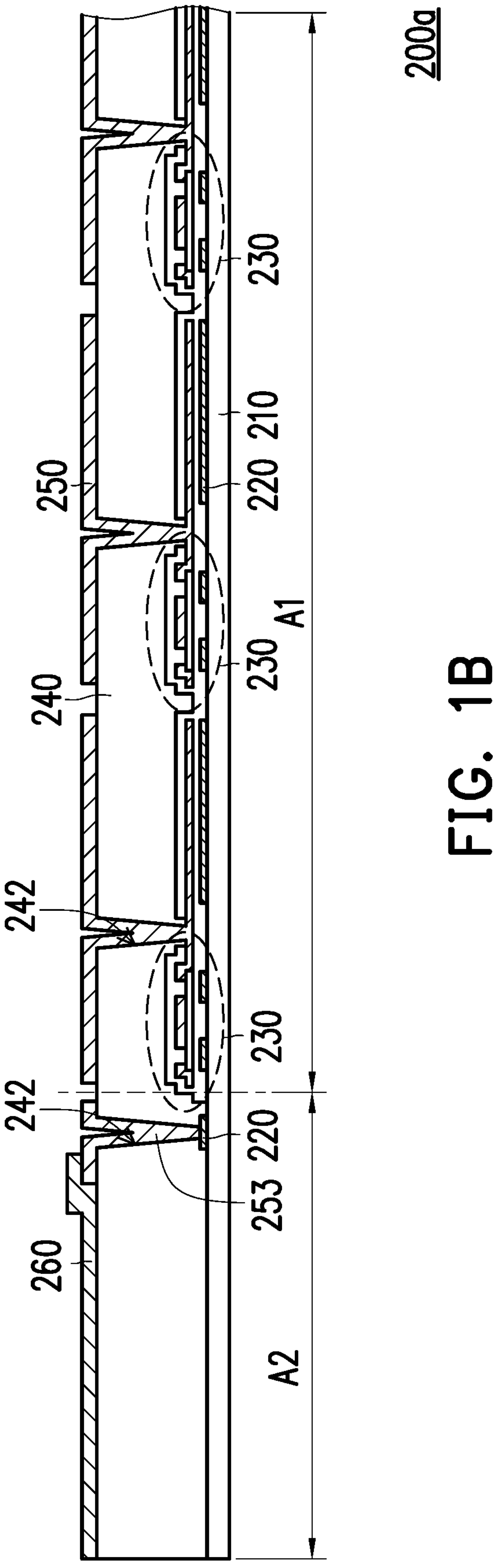
FIG. 1B is a partially enlarged schematic cross-sectional view of an array substrate of the display device of FIG. 1A.
Figure 1C:
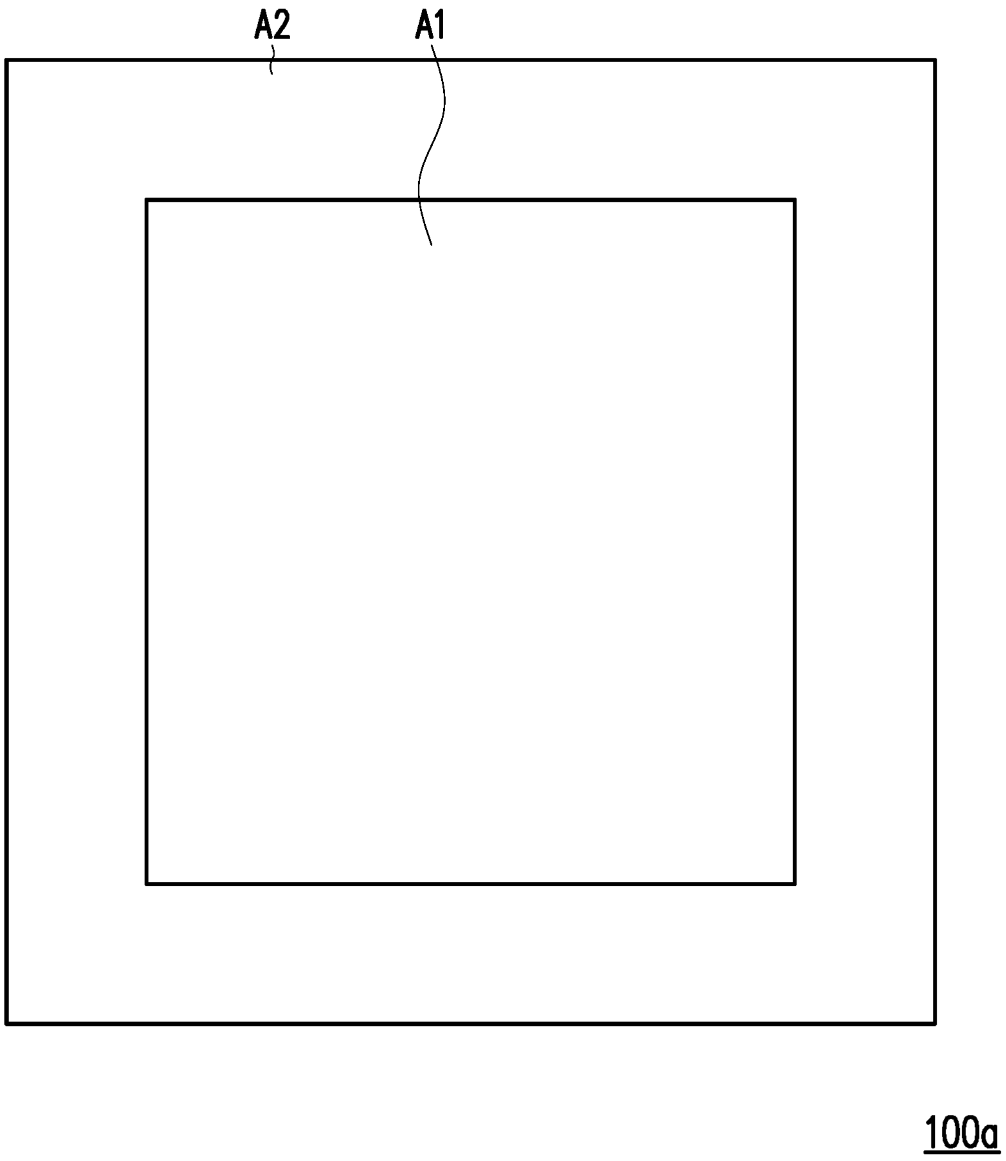
FIG. 1C is a schematic top view of the display device of FIG. 1A.
Figure 1D:
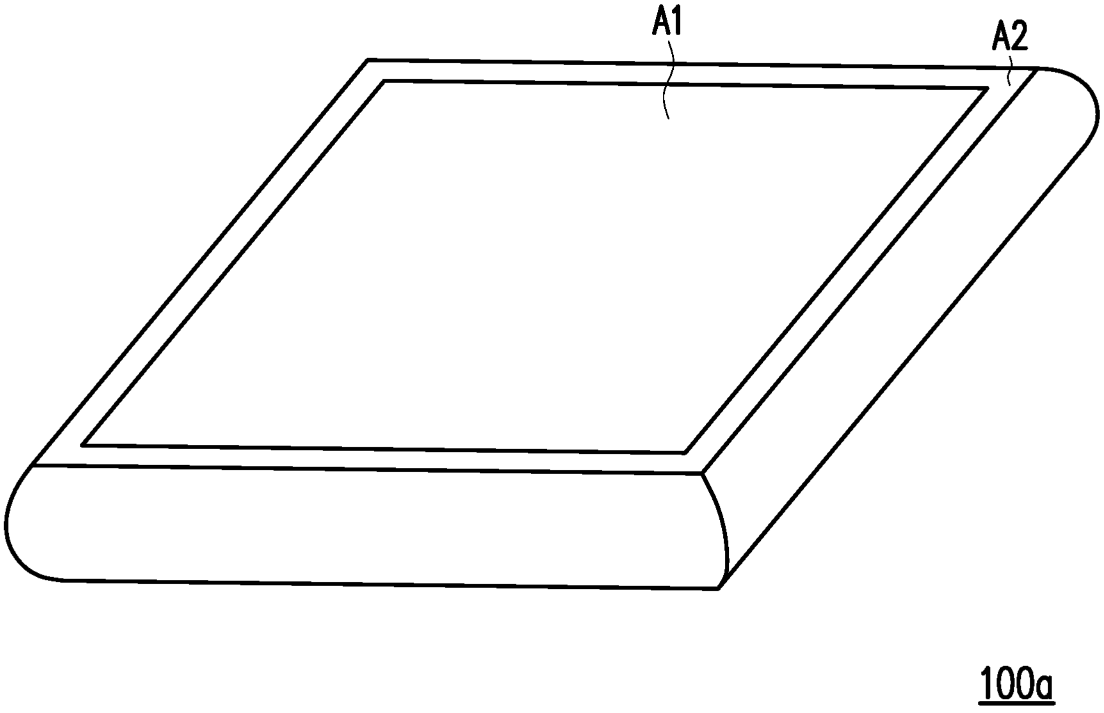
FIG. 1D is a schematic three-dimensional view of the display device of FIG. 1A.

FIG. 1A is a schematic cross-sectional view of a display device according to an embodiment of the disclosure. FIG. 1B is a partially enlarged schematic cross-sectional view of an array substrate of the display device of FIG. 1A. FIG. 1C is a schematic top view of the display device of FIG. 1A. FIG. 1D is a schematic three-dimensional view of the display device of FIG. 1A. For illustrative purposes, FIG. 1C and FIG. 1D only schematically illustrate/label an active area and a peripheral area of the array substrate.

Referring to FIG. 1A, FIG. 1B, and FIG. 1C, in this embodiment, a display device 100*a* includes an array substrate 200*a* and a display structure 300*a*. The display structure 300*a* is disposed on the array substrate 200*a*, and is assembled with the array substrate 200*a* to form the display device 100*a*. The array substrate 200*a* includes a substrate 210, a gate line 220, multiple active elements 230, a protective layer 240, and a pixel electrode 250. The substrate 210 has an active area A1 and a peripheral area A2 located around the active area A1. The peripheral area A2 surrounds the active area A1, but is not limited thereto. The gate line 220 is disposed in the active area A1 of the substrate 210, in which the gate line 220 directly contacts the substrate 210 and exposes a surface of a portion of the substrate 210. The active elements 230 are distributed in the active area A1 of the substrate 210, in which the active elements 230 are, for example, bottom gate thin film transistors (bottom gate TFT). That is, the array substrate 200*a* of this embodiment is embodied as an active element array substrate, which may be, for example, a thin film transistor (TFT) array substrate, but is not limited thereto. The protective layer 240 is disposed on the substrate 210 and covers the gate line 220 and the active elements 230. The protective layer 240 has multiple openings 242, and the openings 242 expose a portion of the gate line 220 and a portion of the active element 230. The pixel electrode 250 is disposed in the active area A1 of the substrate 210 and is located on the protective layer 240. The pixel electrode 250 is extended to and disposed in the openings 242 of the protective layer 240 to electrically connect to the gate line 220 and the active elements 230. In addition, the pixel electrode 250 includes at least one passively driven pixel electrode 253.

Referring to FIG. 1A again, the display structure 300*a* of this embodiment includes a transparent substrate 310, a display medium layer 320, and a conductive electrode 330. The transparent substrate 310 has an active display area A3 and a passive display area A4 located around the active display area A3. Here, the active display area A3 may be disposed corresponding to the active area A1, and the passive display area A4 may be disposed corresponding to the peripheral area A2. A material of the transparent substrate 310 is, for example, thermoplastic material, but is not limited thereto. The display medium layer 320 is disposed in the active display area A3 and the passive display area A4 of the transparent substrate 310. The display medium layer 320 is, for example, an electrophoretic display film or an electrowetting display film, but is not limited thereto. Here, the display medium layer 320 may be, for example, a microcapsule electrophoretic display medium. The microcapsule electrophoretic display medium may include multiple microcapsules 322, and each of the microcapsules 322 includes an electrophoresis solution 322*a*, multiple black charged particles 322*b*, and multiple white charged particles 322*c*. The conductive electrode 330 is disposed in the active display area A3 and the passive display area A4 of the transparent substrate 310, and is located between the transparent substrate 310 and the display medium layer 320.

In particular, in this embodiment, the array substrate 200*a* further includes an extension electrode 260 disposed in the peripheral area A2 of the substrate 210 and located on the protective layer 240. A portion of the extension electrode 260 is extended to and overlapped with the pixel electrode 250, and is electrically connected to the pixel electrode 250. Here, the portion of the extension electrode 260 is extended to and overlapped with the passively driven pixel electrode 253 of the pixel electrode 250. That is, orthographic projection of the portion of the extension electrode 260 on the substrate 210 overlaps orthographic projection of the pixel electrode 250 on the substrate 210, so that an inconspicuous boundary is formed between the extension electrode 260 and the pixel electrode 250, which may make the overall visual experience more integrated. Here, a material of the extension electrode 260 is different from a material of the pixel electrode 250. The material of the pixel electrode 250 includes, for example, indium tin oxide (ITO) or indium zinc oxide (IZO), and the material of the extension electrode 260 includes an organic polymer conductive material, such as poly ethylene dioxythiophene compound (PEDOT:PSS), or other appropriate stretchable materials such as silver paste, carbon paste, but not limited thereto. The display medium layer 320 of the display structure 300*a* is located on the pixel electrode 250 and the extension electrode 260 of the array substrate 200*a*. That is, orthographic projection of the display medium layer 320 on the substrate 210 overlaps the orthographic projection of the pixel electrode 250 and orthographic projection of the extension electrode 260 on the substrate 210.

Referring to FIG. 1A again, in this embodiment, the display structure 300*a* may further include a sealing layer 325 disposed on the conductive electrode 330 and the protective layer 240 of the array substrate 200*a* to seal the display structure 300*a* and the array substrate 200*a*. Here, an edge of the display structure 300*a* is substantially flush with an edge of the array substrate 200*a*, meaning that a size of the display structure 300*a* is the same as a size of the array substrate 200*a*. Furthermore, the display structure 300*a* may further include a barrier layer 340, a cover plate 350, and an optical adhesive layer 360. The barrier layer 340 is located between the transparent substrate 310 and the conductive electrode 330, the optical adhesive layer 360 is located between the cover plate 350 and the transparent substrate 310, and the cover plate 350 is fixed on the transparent substrate 310 through the optical adhesive layer 360. In addition, the display device 100*a* of this embodiment may further include a barrier layer 400 disposed on a side surface of the substrate 210 of the array substrate 200*a* that is relatively far away from the display structure 300*a*. Here, the display device 100*a* is embodied as an electrophoretic display device.

It should be noted that components of the display structure 300*a* of this embodiment (e.g., the transparent substrate 310, the barrier layer 340, the cover plate 350, and the optical adhesive layer 360) have the property of being flexible and stretchable. In addition, referring to FIG. 1A, FIG. 1C, and FIG. 1D, after the display structure 300*a* is assembled on the array substrate 200*a* to form the display device 100*a*, a border of the peripheral area A3 may be formed into a rounded arc shape or other shapes through the thermoforming process, so that the texture of the entire display device 100*a* may be further enhanced.

Since the extension electrode 260 of the array substrate 200*a* in this embodiment is disposed in the peripheral area A2 of the substrate 210, and the portion of the extension electrode 260 is extended to and overlapped with the pixel electrode 250 and is electrically connected to the pixel electrode 250, it is possible to control the display of the image in the active area A1/active display area A3 and at the same time, to enable the peripheral area A2/passive display area A4 to have the ability to control the display medium layer 320, may be matched with an image display to present different colors. Further, that is, while the active area A1 is driven, a specific voltage may be provided to the extension electrode 260 of the peripheral area A2. The specific voltage makes the display medium layer 320 located in the peripheral area A2/passive display area A4 present specific colors, which may customize color of a border to make the overall presentation of the display device 100*a* more consistent, so as to achieve a borderless user experience for users.

It should be noted here that the following embodiments follow the numeral references and part of the content of the foregoing embodiments, where the same numeral references are used to represent the same or similar elements, and descriptions of the same technical content are omitted. For descriptions of omitted parts, reference may be made to the foregoing embodiments and will not be repeated in the following embodiments.

Figure 2:
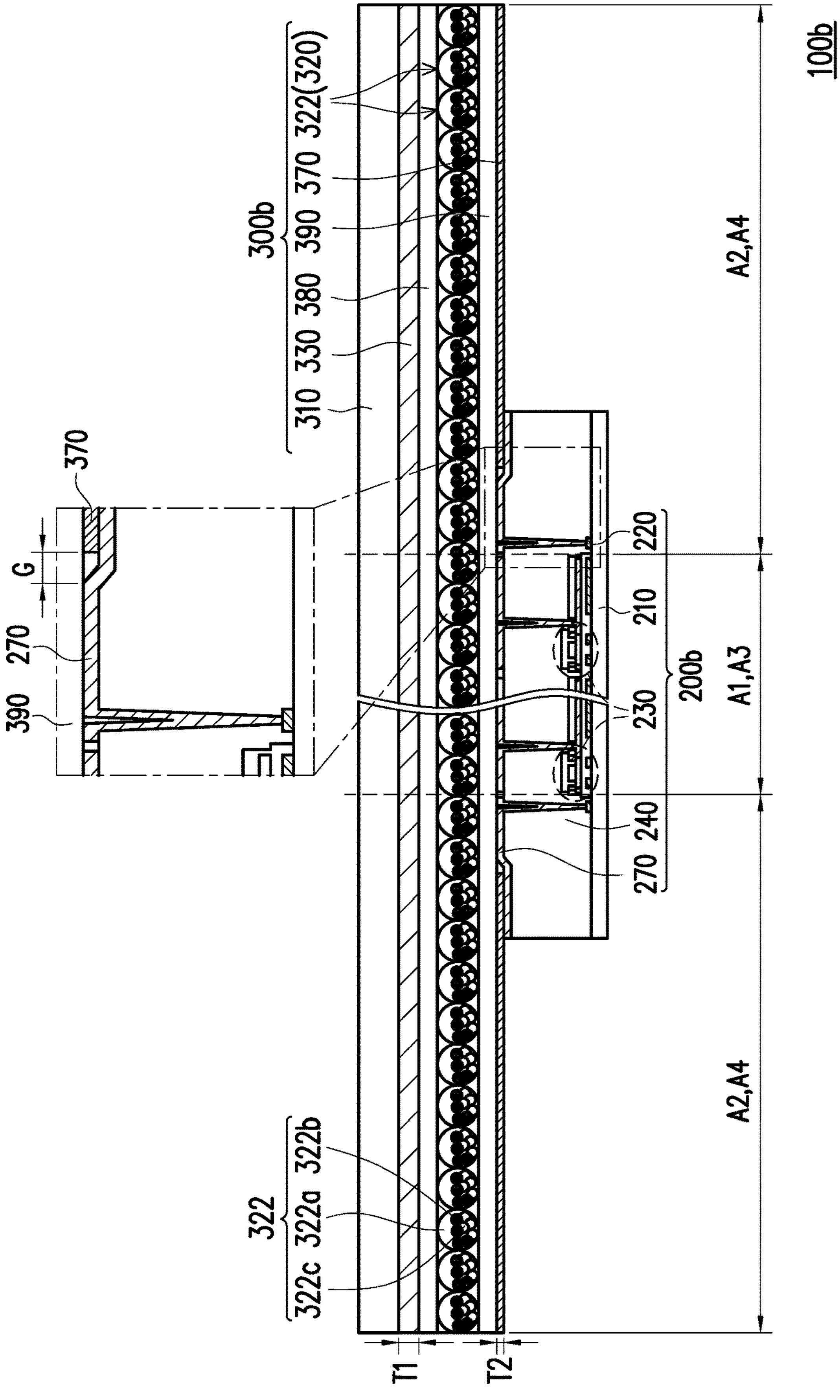
FIG. 2 is a schematic cross-sectional view of a display device according to another embodiment of the disclosure.

FIG. 2 is a schematic cross-sectional view of a display device according to another embodiment of the disclosure. Referring to FIG. 1A and FIG. 2 at the same time, a display device 100*b* of this embodiment is similar to the display device 100*a*. The difference between the two is that in this embodiment, an array substrate 200*b* does not have an extension electrode, and a pixel electrode 270 thereof is disposed in the active area A1 and the peripheral area A2 of the substrate 210, and is located on the protective layer 240. Furthermore, a display structure 300*b* of this embodiment further includes an extension electrode 370 disposed in the passive display area A4 of the transparent substrate 310. The display medium layer 320 is located between the conductive electrode 330 and the extension electrode 370, and the extension electrode 370 at least exposes the display medium layer 320 located in the active display area A3. Here, the conductive electrode 330 has a first thickness T1, the extension electrode 370 has a second thickness T2, and the second thickness T2 is, for example, less than 20 microns. The first thickness T1 may be greater than or less than the second thickness T2, and is not limited thereto. The extension electrode 370 is electrically connected to the pixel electrode 270 of the array substrate 200*b* and is extended outside the array substrate 200*b*. That is, a size of the display structure 300*b* is larger than a size of the array substrate 200*b*. Here, a material of the extension electrode 370 may be the same as a material of the conductive electrode 330, which may be an organic polymer conductive material, such as poly ethylene dioxythiophene compound (PEDOT:PSS), or other appropriate stretchable materials such as silver paste, carbon paste, but not limited thereto. In one embodiment, when the extension electrode 370 is made of poly ethylene dioxythiophene compound (PEDOT:PSS), the thickness thereof may be, for example, 0.5 microns. In another embodiment, when the extension electrode 370 is made of stretchable silver paste, the thickness thereof may be, for example, 6 microns. In one embodiment, when the extension electrode 370 is made of stretchable carbon paste, the thickness thereof may be, for example, 10 microns.

Since the second thickness T2 of the extension electrode 370 is greater than 0 microns and less than 20 microns, and the display structure 300*b* has the property of being flexible and stretchable, when the display structure 300*b* is assembled on the array substrate 200*b*, a seam G formed may be less than 30 microns visible to the naked eye. Thus, the display device 100*b* of this embodiment is embodied as an electrophoretic display device without an active/passive drive display seam. On the other hand, since the passive display area A4 of the display structure 300*b* may be stretched to the outside the array substrate 200*b* and may be three-dimensionally molded, in this way, it is possible to make the display device 100*b* of the embodiment stretchable, three-dimensionally moldable, and may display information at the same time, which is different from the conventional applications, and more display methods may be developed for different usage situations.

In addition, referring to FIG. 2 again, in this embodiment, the display structure 300*b* further includes a first protective film 380 and a second protective film 390. The first protective film 380 is disposed in the active display area A3 and the passive display area A4 of the transparent substrate 310, and is located between the display medium layer 320 and the conductive electrode 330. The second protective film 390 is disposed in the active display area A3 and the passive display area A4 of the transparent substrate 310, and is located between the display medium layer 320 and the extension electrode 370.

It should be noted that in other embodiments not shown, a number of the active display area A3 may be more than one, depending on the design requirements of the product. Furthermore, the display device 100*b* may also be molded into the desired frame appearance of the passive display area A4 through the thermoforming process, which may further enhance the texture of the entire display device 100*b*. In addition, while the active area A3 is driven, a specific voltage may be provided to the extension electrode 370 of the passive display area A4. The specific voltage makes the display medium layer 320 located in the passive display area A4 present specific colors, which may customize color of a border to make the overall presentation of the display device 100*b* more consistent, so as to achieve a borderless user experience for users.

In short, in this embodiment, one of the array substrates 200*a*, 200*b* and the display structures 300*a*, 300*b* in the display devices 100*a*, 100*b* includes the extension electrodes 260, 370, and the extension electrodes 260, 370 meet one of the following conditions. (1) The extension electrode 260 is disposed in the peripheral area A2 of the substrate 210 and is located on the protective layer 240. A portion of the extension electrode 260 is extended to and overlapped with the passively driven pixel electrode 253 of the pixel electrode 250, and is electrically connected to the pixel electrode 250. (2) The electrode extension 370 is disposed in the passive display area A4 of the transparent substrate 310. The display medium layer 320 is located between the conductive electrode 330 and the extension electrode 370. The conductive electrode 330 has a first thickness T1, the extension electrode 370 has a second thickness T2, and the second thickness T2 is less than 20 microns. By the above design, the peripheral area A2/passive display area A4 of the display devices 100*a* and 100*b* may also have the ability to control the display medium layer 320 located in the peripheral area A2/passive display area A4, which may customize color of a border to make the overall presentation of the display devices 100*a* and 100*b* more consistent, so as to achieve a borderless user experience for users.

To sum up, in the design of the disclosure, the array substrate or the display structure includes the extension electrode, and the extension electrode is disposed in the peripheral area/passive display area, so that the peripheral area/passive display area also has ability of controlling the display medium layer located in the peripheral area/passive display area. Thus, when the array substrate is bonded to the display structure to form a display device, the peripheral area may be matched with an image display to present different colors, which may customize color of a border to make the overall presentation of the display device more consistent, so as to achieve a borderless user experience for users.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An array substrate comprising:

a substrate having an active area and a peripheral area located around the active area;

a gate line disposed in the active area of the substrate;

a plurality of active elements distributed in the active area of the substrate;

a protective layer disposed on the substrate and covering the gate line and the active elements, wherein the protective layer has a plurality of openings, and the openings expose a portion of the gate line and a portion of the active elements;

a pixel electrode disposed in the active area of the substrate and located on the protective layer, wherein the pixel electrode is extended to and disposed in the openings of the protective layer to electrically connect to the gate line and the active elements, and the pixel electrode comprises at least one passively driven pixel electrode; and an extension electrode disposed in the peripheral area of the substrate and located on the protective layer, wherein a portion of the extension electrode is extended to and overlapped with the at least one passively driven pixel electrode of the pixel electrode and is electrically connected to the pixel electrode.

2. The array substrate according to claim 1, wherein a material of the pixel electrode is different from a material of the extension electrode.

3. The array substrate according to claim 2, wherein the material of the pixel electrode comprises indium tin oxide or indium zinc oxide, and the material of the extension electrode comprises poly ethylene dioxythiophene compound, silver paste, or carbon paste.

4. A display structure comprising:

a transparent substrate having an active display area and a passive display area located around the active display area;

a display medium layer disposed in the active display area and the passive display area of the transparent substrate;

a conductive electrode disposed in the active display area and the passive display area of the transparent substrate, and located between the transparent substrate and the display medium layer;

an extension electrode disposed in the passive display area of the transparent substrate, and the display medium layer located between the conductive electrode and the extension electrode, wherein the conductive electrode has a first thickness, the extension electrode has a second thickness, and the second thickness is less than 20 microns;

a first protective film disposed in the active display area and the passive display area of the transparent substrate, and located between the display medium layer and the conductive electrode; and a second protective film disposed in the active display area and the passive display area of the transparent substrate, and located between the display medium layer and the extension electrode.

5. The display structure according to claim 4, wherein a material of the conductive electrode and the extension electrode comprises poly ethylene dioxythiophene compound, silver paste, or carbon paste, respectively.

6. A display device comprising:

an array substrate comprising a substrate having an active area and a peripheral area located around the active area;

a gate line disposed in the active area of the substrate;

a plurality of active elements distributed in the active area of the substrate;

a protective layer disposed on the substrate and covering the gate line and the active elements, wherein the protective layer has a plurality of openings, and the openings expose a portion of the gate line and a portion of the active elements; and a pixel electrode disposed in the active area of the substrate and located on the protective layer, wherein the pixel electrode is extended to and disposed in the openings of the protective layer to electrically connect to the gate line and the active elements, and the pixel electrode comprises at least one passively driven pixel electrode; and a display structure disposed on the array substrate, wherein the display structure comprises:

a transparent substrate having an active display area and a passive display area located around the active display area;

a display medium layer disposed in the active display area and the passive display area of the transparent substrate; and a conductive electrode disposed in the active display area and the passive display area of the transparent substrate, and located between the transparent substrate and the display medium layer;

wherein one of the array substrate and the display structure further comprises an extension electrode, and the extension electrode meets one of the following conditions:

(1) the extension electrode disposed in the peripheral area of the substrate and located on the protective layer, and a portion of the extension electrode extended to and overlapped with the at least one passively driven pixel electrode of the pixel electrode and electrically connected to the pixel electrode; and (2) the extension electrode disposed in the passive display area of the transparent substrate, and the display medium layer located between the conductive electrode and the extension electrode, wherein the conductive electrode has a first thickness, the extension electrode has a second thickness, and the second thickness is less than 20 microns.

7. The display device according to claim 6, wherein a material of the pixel electrode is different from a material of the extension electrode.

8. The display device according to claim 6, wherein the array substrate comprises the extension electrode, and the display medium layer of the display structure is located on the pixel electrode and the extension electrode of the array substrate.

9. The display device according to claim 6, wherein the display structure comprises the extension electrode, and the extension electrode is electrically connected to the pixel electrode of the array substrate and is extended outside the array substrate.

* * * * *